United States Patent [19]
Kumpitsch et al.

[11] Patent Number: 4,713,878
[45] Date of Patent: Dec. 22, 1987

[54] MOLD METHOD FOR SUPERCONDUCTIVE JOINT FABRICATION

[75] Inventors: Robert C. Kumpitsch, Johnstown; James P. Retersdorf, Gloversville, both of N.Y.

[73] Assignee: General Electric Company, Schenectady, N.Y.

[21] Appl. No.: 678,443

[22] Filed: Dec. 5, 1984

[51] Int. Cl.$^4$ .................................... H01L 39/24
[52] U.S. Cl. ..................... 29/599; 174/126 S; 174/128 S
[58] Field of Search ............. 29/599; 174/10, 70 R, 174/87, 90, 94 R, 94 S, 126 R, 126 S, 128 S

[56] References Cited

U.S. PATENT DOCUMENTS

| | | | |
|---|---|---|---|
| 2,615,074 | 10/1962 | Bronovicki | 29/860 X |
| 3,156,539 | 11/1964 | Lee et al. | 29/194 |
| 3,169,859 | 2/1965 | Lee et al. | 75/134 |
| 3,346,351 | 10/1967 | Flashman | 29/194 |
| 3,422,529 | 1/1969 | Nuding | 29/599 |
| 3,449,818 | 6/1969 | Lowe et al. | 29/470.5 |
| 3,453,378 | 7/1969 | McInturff | 174/94 |
| 3,469,020 | 9/1969 | Broom et al. | 29/872 X |
| 3,507,949 | 4/1970 | Campbell | 29/860 X |

OTHER PUBLICATIONS

A. J. Moorhead et al., "Soldering of Copper-Clad Niobium-Titanium Superconductor Deposit", *Welding Journal*, Oct. 1977, pp. 23–31.

W. H. Warren, Jr. et al., "Superconductivity Measurements in Solders Commonly Used for Low Temperature Research", *Reviews of Scientific Instruments*, vol. 40, Jun. 1969, p. 180.

R. F. Thornton, "Superconducting Joint for Superconducting Wires and Coils and Method of Forming", U.S. patent application Ser. No. 567,117 filed Dec. 30, 1983.

D. W. Jones, "Method of Forming a Superconductive Joint Between Multifilament Superconductors", U.S. patent application Ser. No. 530,926, filed Sep. 12, 1983.

Primary Examiner—Howard N. Goldberg
Assistant Examiner—Carl J. Arbes
Attorney, Agent, or Firm—Lawrence D. Cutter; James C. Davis, Jr.; Marvin Snyder

[57] ABSTRACT

A method for joining multifilamentary superconductive wire comprises disposing the ends of the wires in a hot liquid metal stripping bath for removal of the metal matrix. In particular, in the present invention the ends of the wires to be joined are agitated within this bath to assure complete removal of the metal matrix. The liberated superconductive filaments are then disposed in a solder bath and then inserted into a mold which is filled with hot liquid superconductive solder which is allowed to solidify around the filamentary conductors after which the mold is removed.

29 Claims, 4 Drawing Figures

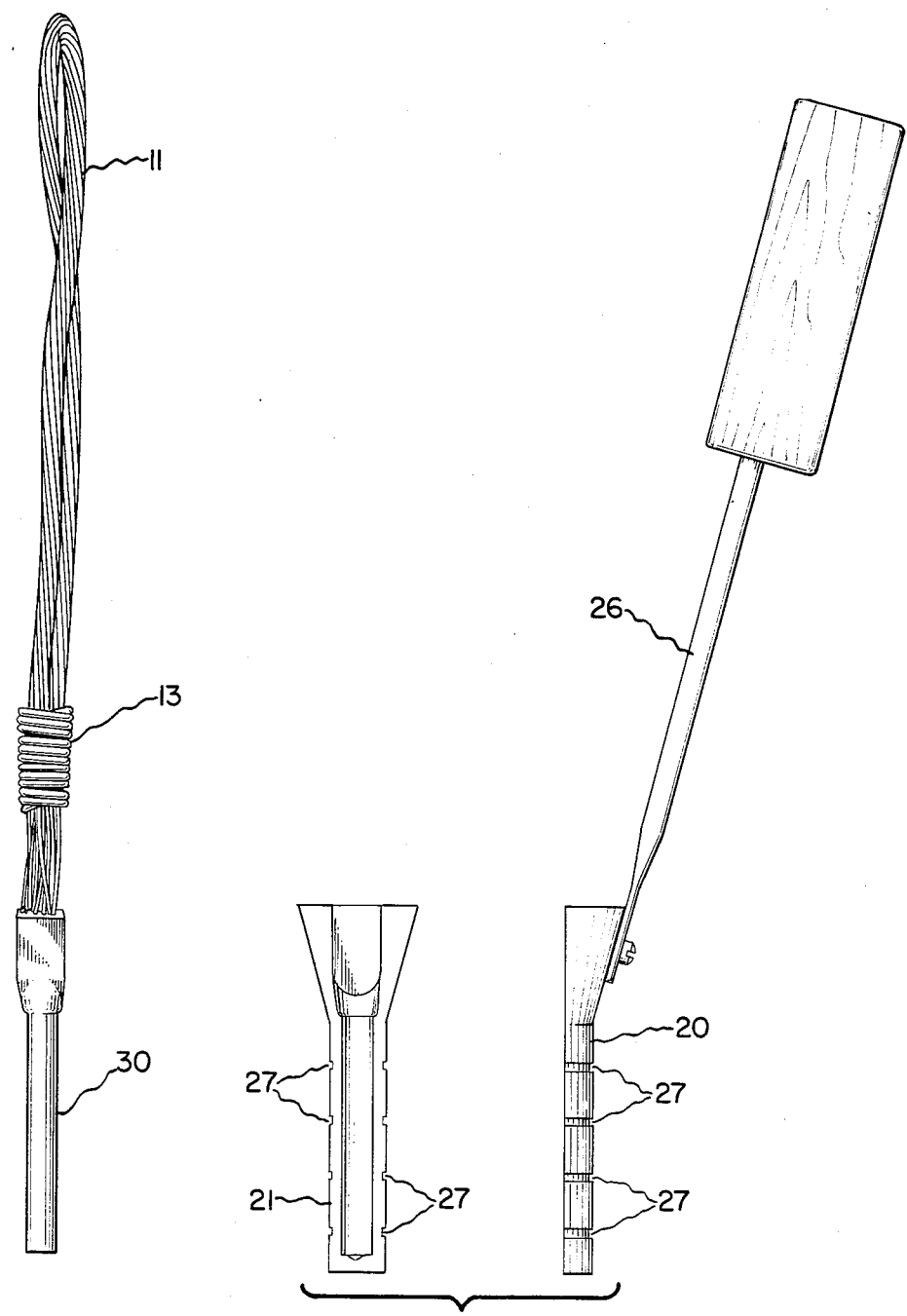

MOLD METHOD FOR SUPERCONDUCTIVE JOINT FABRICATION

BACKGROUND OF THE INVENTION

The present invention relates to methods for fabricating superconductive joints, particularly in multifilamentary superconductive wires or cables. Even more particularly, the present invention relates to a mold based method for superconductive joint fabrication which employs agitation of the wires in a solution for stripping the metal matrix surrounding the multifilamentary superconductive strands.

A growing list of materials has now been found to exhibit superconductive properties when are cooled to temperatures below a critical value. Below this temperature all electrical resistance disappears. This permits the maintenance of current flow in superconductive circuits without external energy or power sources. In particular, superconductive conductors disposed in the form of electrical solenoids and coils of various configurations are capable of substantially continuous operation with no requirements to add additional electrical energy to the circuit. Superconductive circuits employing such solenoids are particularly advantageous in nuclear magnetic resonance (NMR) medical diagnostic imaging and spectroscopy systems. Moreover, superconductive circuits have found utility in a number of applications including power distribution and in magnetically levitated vehicles.

In any application in which superconductive wire is employed, it is almost variably necessary to employ one or more superconductive joints. However, to ensure that the resulting closed loop or circuit is entirely superconductive, it is necessary to ensure that the joint between the wire ends is also superconductive. However, superconductive materials display a tendency to undergo sudden and unexpected transitions to the resistive or ohmic state from the superconductive state. This phenomenon is referred to as quenching. The reasons for this phenomenon are not thoroughly understood. However, it is strongly believed that localized heating effects contribute to the phenomenon. However, the precise physical reasons for quenching do not yet appear to be fully understood. Accordingly, methods for its prevention are best describable as empirical rather than theoretical.

While quenching phenomena can occur in any portion of a superconductive circuit, it nonetheless appears that superconductive joints are in fact particularly susceptible to quench phenomena. Quenching is undesirable for at least three reasons. Firstly, quench conditions require restoration of the current in the circuit. Secondly, quench conditions often result in the undesired heating of the cryogenic fluid, typically liquid helium. Thirdly, quenching can cause damage to unprotected circuit elements. Accordingly, because of the undesired consequences of quenching and because of the particular susceptibility of superconductive joints to quench phenomena, it is seen that it is important to fabricate superconductive joints which are as immune as possible to this phenomenon.

In the case in which superconductive wires are to carry high levels of electrical current, for example 1,000 amperes and above, it is common practive to employ multifilamentary superconductive material. Typically such superconductive material comprises a carrier or matrix metal such as copper or copper-nickel alloy or a similar matrix conductor in which filaments of niobium-titanium alloy are incorporated. In such conductors an array of filaments are imbedded within a bulk carrier matrix. The formation of superconductive joints between multifilamentary wire ends poses particularly difficult problems. For example, in one form of superconductive joint the individual filaments are soldered to a superconductive sheet individually. This is a highly labor intensive operation. While this operation produces workable superconductive joints having even greater reliability against quenching.

A number of publications and patents deal with niobium-titanium superconductors and methods and means of forming joints between such superconductors.

One such publication is an article appearing in the October 1977 issue of *Welding Journal* starting at page 23 and titled "Soldering of Copper-Clad Niobium-Titanium Superconductor Composite" and dealing with the use of a variety of solders and fluxes. The solder joints were not superconducting. No flux was found which permitted and/or caused the solder to wet the superconducting filaments.

A method of forming a superconductive butt joint between copper-clad niobium-titanium superconductors by overwrapping the butt joint with smaller shunt superconductors and attaching the shunt in place by solder including a lead-bismuth solder is disclosed in U.S. Pat. No. 3,453,378. Various prior art methods of forming superconducting joints are disclosed in this patent as well as problems arising from failure of such joints.

The properties of various solders including solders containing lead and bismuth potentially useful in forming superconducting joints are disclosed in the article titled "Superconductivity Measurements In Solders Commonly Used for Low Temperature Research" appearing at page 180 of *Reviews of Scientific Instruments*, Vol. 40, January 1969.

A superconductive connection involving use of solders is described in U.S. Pat. No. 3,346,351 assigned to the same assignee as the present application.

A variety of superconductive solders and their uses are described in U.S. Pat. No. 3,156,539 also assigned to the same assignee as the subject application.

Formation of a superconductive joint employing combination of a superconductive low melting alloy containing combinations of lead-bismuth-tin and an outer crimped sleeve are taught in U.S. Pat. No. 3,449,818.

A method of making superconductive joints is also disclosed in U.S. Pat. No. 3,422,529 and is based upon the use of a crimped sleeve or cylinder which may comprise either stainless steel or a superconductive alloy. This patent however does not describe the use of solders or the multifilamentary condition and in particular requires twisting a pair of solid superconductive wires.

Accordingly, it is seen that many researchers have sought methods for forming reliable superconductive joints. It is also seen that the methods found have been sought empirically and that satisfactory explanations for the success of certain methods have not been forthcoming.

SUMMARY OF THE INVENTION

In accordance with a preferred embodiment of the present invention a method for forming superconductive joints, particularly in multifilamentary superconductive wire, comprises a multistep process. First the ends of the multifilamentary superconductive wires to be joined are disposed in a hot liquid metal stripping bath for removal of the metal matrix. It is a particular feature of one embodiment of the present invention that these wire ends are moved or agitated relative to this stripping bath while disposed therein. The wire ends are then removed from the bath and inserted into a hot liquid superconductive solder bath. The wire ends are then removed from the solder bath, crimped if desired, and inserted into a mold. The mold, with wires in place, is then reinjected into the solder bath so as to fill the mold. The solder is allowed to solidify in said mold and the mold is removed from around said joint thereby forming a highly reliable superconductive joint. In practice, this process is preferably carried out in a controlled atmosphere, such as argon under standard temperature and pressure conditions. Accordingly, it is seen that the method of the present invention is capable of producing reliable superconductive joints and correspondingly reliable superconductive circuit elements such as coils, solenoids, windings and the like.

Accordingly, it is an object of the present invention to provide a reliable superconductive joint.

It is also an object of the present invention to provide a method which is particularly suitable for joining multifilamentary superconductive cables.

It is yet another object of the present invention to reduce the possibility of quenching in superconductive circuits.

It is also an object of the present invention to provide a method of superconductive joint fabrication which is not only repeatable but is also amenable to automation.

Lastly, but not limited hereto, it is an object of the present invention to provide reliable superconductive circuit elements.

DESCRIPTION OF THE FIGURES

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

FIG. 2 illustrates mold halves employed in the present invention;

FIG. 3 illustrates a superconductive joint fabricated in accordance with the present invention;

DETAILED DESCRIPTION OF THE INVENTION

Figure 1:
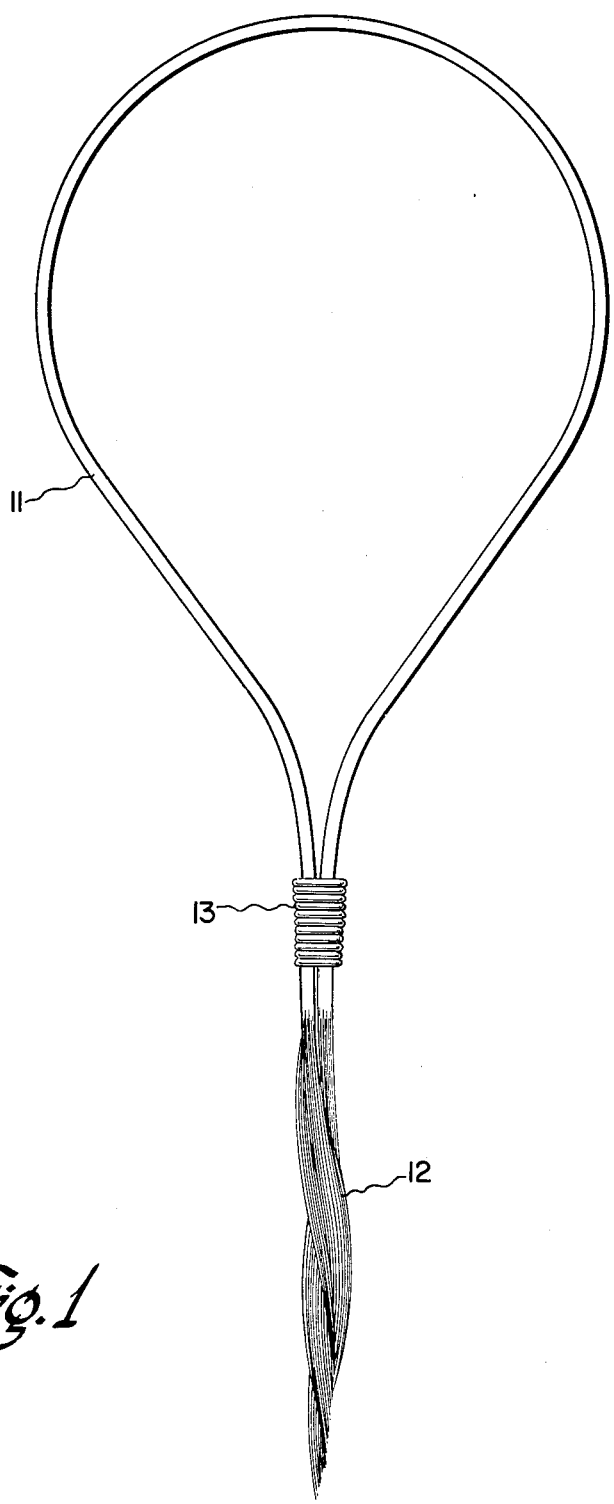
FIG. 1 illustrates a typical superconductive joint made by a prior art "dip and twist" process.

In a preferred embodiment of the present invention a superconductive joint between multifilamentary superconductive cables or wires is formed as follows. It is first necessary to remove any metal matrix surrounding the superconductive filaments from the end portions of the wires to be joined. This is accomplished by disposing the ends of the wires in a hot liquid metal stripping bath for removal of the metal matrix. Typically, the metal matrix comprises either copper or an alloy of copper and nickel. A suitable stripping bath comprises a material such as tin in which the copper or copper/nickel alloy is soluble. The tin stripping bath is typically maintained at a temperature of approximately 400° C. For a superconductive wire in which a copper matrix surrounds filaments of superconductive niobium-titanium, it is preferable to maintain the wires in such a stripping bath for approximately 45 minutes. In the case in which a copper-nickel matrix surrounds niobium-titanium superconductive strands, it is preferable to maintain the wire ends to be stripped in the tin bath for a period of approximately 180 minutes, again at a temperature of approximately 400° C. It is also inportant for the preferred embodiment of the present invention to mechanically agitate or move the wire ends relative to the fluid in the stripping bath. This provides a flushing action which facilitates complete removal of the surrounding matrix material. One means for accomplishing this flushing action is to rotate either the bath containing the wire ends or the mechanism holding the wire ends. For example, in a cylindrical bath having a diameter of approximately 6 inches, it has been found to be useful to rotate the bath at a rate of approximately 4 rotations per minute. Additionally, the tin employed in the stripping bath should be of high purity. For example, tin of "five-nines" purity in desirable, that is tin having a purity of 99.99999%.

Additionally, it is noted that it is preferable to carry out the various steps of the present invention in a controlled atmosphere. For example, the process may be carried out in a conventional laboratory "glove box" in which an inert atmosphere is present. An atmosphere comprising argon gas is preferred because of its inertness and relatively inexpensive cost. Xenon gas also could be employed, at atmospheric pressure as above, but the relatively higher cost of xenon gas makes argon the gas of preference. It is also noted that vacuum conditions also provide the kind of inert environment appropriate for carrying out the steps of the present invention. However, because of the relative difficulty of maintaining vacuum conditions such conditions do not comprise a preferred embodiment of the present invention. However, vacuum conditions may be more appropriate for commercial scale operations employing automated joint fabrication. It is also noted however that nitrogen does not in fact constitute a suitable atmosphere for the carrying out of the present invention. Additionally, it is preferred that the atmosphere in the glove box contained less than approximately 10 parts per million of moisture.

After an appropriate residence time in the stripping bath the wire ends to be joined are removed and disposed in a hot liquid superconductive solder, such as a mixture of lead and bismuth at a temperature of approximately 400° C. The lead bismuth solder which is preferred in the present method comprises approximately 40% lead and 60% bismuth by weight. However, a mixture containing approximately 35% lead and 65% bismuth or solutions in between these ranges are also employable. As in the tin stripping bath, high purity materials are desired. For example, it is preferred that the lead in the solder be 99.9999% pure and the bismuth to be 99.99999% pure. Additionally, the lead in the solder bath is preferably pretreated by deoxidation in a graphite mold for a period of one hour at a temperature of approximately 450° C. under vacuum conditions. In the case of niobium-titanium superconductive filaments disposed in a copper matrix a residence time of approxiamtely 15 minutes in a lead-bismuth solder bath is preferred. In the case of niobium-titanium superconductive filaments disposed in a copper-nickel matrix it is desired to maintain the stripped ends of the wires to be joined in the superconductive solder path for a period of approximately 45 minutes.

Figure 4:
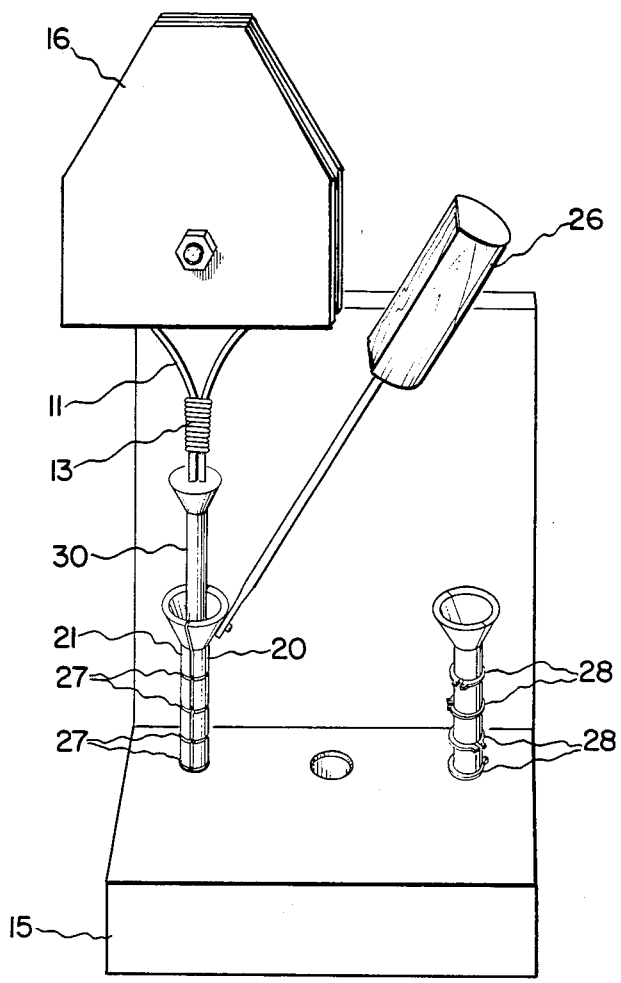
FIG. 4 illustrates the molds and a joint of the present invention in position in a chill holder.

After an appropriate residence time in the solder bath the wire ends are removed, clustered or grouped together (if desired), inserted into a mold, and the ends are thereafter reinserted into the solder bath. Suitable molds are shown in FIGS. 2 and 4 which are more completely discussed below. After about 5 minutes in the solder bath the mold, now filled with solder, is removed and placed in a chill stand for cooling. Once the solder has solidified, the mold is removed thus releasing a solid, reliable superconductive joint which is typically between one and two inches in length. Additionally, it is also possible to impart a twist to the wire filaments following their removal from the superconductive solder bath and prior to their insertion into the mold.

For superconductive conditions existing at around 10° K. it is also possible to employ tin as a suitable superconductive solder. Accordingly, in such circumstances the solder bath and the stripping bath steps become merged.

FIG. 1 illustrates a prior art superconductive joint structure in which superconductive cable 11 in the shape of a wire loop is provided with superconductive joint 12. Wire loop portion 11 illustrates the condition of the wire prior to stripping of the copper matrix. The multifilamentary nature of the stripped cabling is evident in joint 12. For purposes of holding the wire ends together during joint formation, superconductive wire 13 is seen wrapped around the wires to be joined immediately above the joint. The joint illustrated in FIG. 1 is typical of the "dip and twist" structure described above.

FIG. 2 illustrates two mold halves employable in the process of the present invention. Mold halves 20 and 21 also preferably include grooves 27 for insertion of C-clamps for holding the mold halves together. However, any other convenient clamping mechanism can be employed. FIG. 2 also illustrates that one of the mold halves 20 is fitted with handle 26 for ease of manipulation particularly with respect to insertion into the hot solder bath.

FIG. 3 illustrates superconductive joint 30 fabricated in accordance with the present invention. In particular it is seen in this Figure that some superconductive wire already exists in the form of twisted niobium-titanium strands. It is therefore also seen that the process of the present invention is applicable to such conductors, and it is clear that for such conductors the matrix stripping operation is unnecessary and is accordinglyl by-passed.

FIG. 4 illustrates an empty mold with C-clips 28 holding halves 20 and 21 of the empty mold together in chill holder 15. Also illustrated is convenience holder 16 holding loop 11 of superconductive cable the ends of which have been provided with superconductive joint 30 which is seen being removed from mold halves 20 and 21.

From the above, it should be appreciated that the method of superconductive joint manufacture of the present invention provides a rigid and reliable superconductive joint which is significantly less prone to quench occurrences. It should also be appreciated that the method of the present invention is readily automatable, the use of the mold resulting in uniform and reliable superconductive joints whose manufacture does not depend upon the art or skill of manual assembly.

Accordingly, the method of the present invention produces superconductive joints, solenoids, windings and general superconductive circuits which exhibit improved reliability and uniformity.

While the invention has been described in detail herein in accordance with the preferred embodiments thereof, many modifications and changes therein may be effected by those skilled in the art. Accordingly, it is intended by the appended claims to cover all such modifications and changes as fall within the true spirit and scope of the invention.

The invention claimed is:

1. A method for forming superconductive joints in multifilamentary superconductor wire embedded in a metal matrix, said method comprising the steps of:
   disposing the ends of the multifilamentary superconductor wires to be joined in a hot liquid metal stripping bath for removal of said metal matrix;
   removing said wire ends from said stripping bath;
   disposing said wire ends in a hot liquie superconductive solder;
   removing said wire ends from said hot liquid superconductive solder;
   inserting said wire ends in a mold and filling said mold with hot liquid superconductive solder; and solidifying said solder.

2. The method of claim 1 further comprising the step of removing said mold.

3. The method of claim 1 in which said wire ends are moved relative to said stripping bath while disposed therein.

4. The method of claim 1 in which said multifilamentary wire ends are twisted prior to insertion into said mold.

5. The method of claim 1 in which said mulitfilamentary wire ends are grouped together prior to insertion into said mold.

6. The method of claim 1 in which said hot liquid stripping bath comprises tin.

7. The method of claim 6 in which said superconductive wire to be joined comprises niobium-titanium in a copper matrix and in which said wire ends are disposed in said stripping bath for a period of approximately 45 minutes.

8. The method of claim 6 in which said superconductive wire to be joined comprises niobium-titanium in a copper-nickel matrix and said wire ends are disposed within said stripping bath for a period of approximately 180 minutes.

9. The method of claim 1 in which said hot liquid superconductive solder comprises a mixture of lead and bismuth.

10. The method of claim 9 in which said bismuth is present in amounts ranging from approximately 35% to 40% by weight and said lead is present in amounts from approximately 65% to 60% by weight.

11. The method of claim 10 in which said superconductive wire to be joined comprises niobium titanium in a copper matrix and said wire ends are disposed in said solder bath for a period of approximately 15 minutes.

12. The method of claim 10 in which said superconductive wire to be joined comprises niobium-titanium in a copper-nickel matrix and in which said wire ends are disposed in said solder bath for a period of approximately 45 minutes.

13. The method of claim 1 in which moving said wire is performed by relative rotational movement of said wire ends in said stripping bath.

14. The method of claim 1 in which said process is carried out in a controlled atmosphere.

15. The method of claim 14 in which the atmosphere comprises gases selected from the group consisting of argon and xenon.

16. The method of claim 14 in which said process is carried out under vacuum conditions.

17. The method of claim 14 in which said atmosphere contains less than 10 parts per million of moisture.

18. The method of claim 1 in which said mold includes an elongate, substantially cylindrical cavity for insertion of said wire ends.

19. The method of claim 1 in which said mold comprises separate portions to facilitate removal of the resulting solidified superconductive joint.

20. The method of claim 1 in which said mold comprises material to which said solder does not wet.

21. The method of claim 1 in which said solder comprises tin.

22. The method of claim 1 in which said wire ends are removed from said solder bath prior to insertion of said wire ends in said mold.

23. The method of claim 1 further including the step of inserting said wire ends in said mold in said solder bath.

24. The superconductive joint produced in accordance with the method of claim 1.

25. The superconductive loop produced by the formation of a superconductive joint in accordance with the method of claim 1.

26. A method for forming superconductive joints between a plurality of strands of superconductive wire, said method comprising the steps of:
    disposing the ends of the wires to be joined in a hot liquid metal superconductive solder;
    removing said wire ends from said hot liquid superconductive solder;
    inserting said wire ends in a mold with and filling said mold with hot liquid superconductive solder; and
    solidifying said solder.

27. The superconductive joint produced in accordance with claim 26.

28. The method of claim 1 in which said mold includes a portion exhibiting a cross section having a plurality of straight sides, whereby the completed joint includes a portion for facilitating the immobilization of said joint.

29. The method of claim 26 in which said mold includes a portion exhibiting a cross section having a plurality of straight sides, whereby the completed joint includes a portion for facilitating the immobilization of said joint.

* * * * *

UNITED STATES PATENT AND TRADEMARK OFFICE
CERTIFICATE OF CORRECTION

PATENT NO. : 4,713,878

DATED : December 22, 1987

INVENTOR(S) : Robert C. Kumpitsch et al

It is certified that error appears in the above-identified patent and that said Letters Patent is hereby corrected as shown below:

Column 6, line 20, "liquie" should read -- liquid --.

Signed and Sealed this

Tenth Day of May, 1988

Attest:

DONALD J. QUIGG

*Attesting Officer*     *Commissioner of Patents and Trademarks*